(12) United States Patent
Hidekazu

(10) Patent No.: US 8,815,966 B2
(45) Date of Patent: Aug. 26, 2014

(54) SHEET FOR USE AS A PACKAGING MATERIAL FOR SOLAR CELLS

(75) Inventor: Shibuya Hidekazu, Tokyo (JP)

(73) Assignee: LG Hausys, Ltd., Seoul (KR)

( * ) Notice: Subject to any disclaimer, the term of this patent is extended or adjusted under 35 U.S.C. 154(b) by 0 days.

(21) Appl. No.: 13/883,732

(22) PCT Filed: Nov. 4, 2011

(86) PCT No.: PCT/KR2011/008351
§ 371 (c)(1),
(2), (4) Date: May 6, 2013

(87) PCT Pub. No.: WO2012/060652
PCT Pub. Date: May 10, 2012

(65) Prior Publication Data
US 2013/0231411 A1    Sep. 5, 2013

(30) Foreign Application Priority Data
Nov. 5, 2010 (JP) .......................... 10-2010-0109843

(51) Int. Cl.
*B32B 37/04* (2006.01)
*B32B 17/10* (2006.01)
*H01L 31/048* (2014.01)
*H01L 31/0203* (2014.01)
*C09J 7/00* (2006.01)
*C09J 5/06* (2006.01)

(52) U.S. Cl.
CPC ...... *H01L 31/0203* (2013.01); *B32B 17/10036* (2013.01); *C09J 2203/322* (2013.01); *Y02E 10/50* (2013.01); *B32B 17/10678* (2013.01); *H01L 31/0481* (2013.01); *C09J 7/00* (2013.01); *C09J 5/06* (2013.01); *B32B 17/1055* (2013.01); *C09J 2201/61* (2013.01); *B32B 17/10944* (2013.01); *C09J 2423/04* (2013.01); *C09J 2201/24* (2013.01)

USPC ............................................. 521/52; 136/243

(58) Field of Classification Search
CPC ..................... B32B 17/1055; B32B 17/10944; B32B 37/04; H01L 31/0203; H01L 31/0481; Y02E 10/50
USPC ............................................. 521/52; 136/243
See application file for complete search history.

(56) References Cited

U.S. PATENT DOCUMENTS

| | | | |
|---|---|---|---|
| 7,943,845 B2 * | 5/2011 | Hayes | ........................ 136/251 |
| 2010/0116310 A1 | 5/2010 | Shimizu et al. | |
| 2011/0059361 A1 * | 3/2011 | Wilkening et al. | ......... 429/218.1 |

FOREIGN PATENT DOCUMENTS

| | | |
|---|---|---|
| JP | 2002363507 | 12/2002 |
| JP | 2006190865 | 7/2006 |
| JP | 2008120952 | 5/2008 |
| JP | 2009004437 | 1/2009 |
| JP | 2009218465 | 9/2009 |
| JP | 2010226054 | 10/2010 |
| KR | 1020090073224 | 7/2009 |

OTHER PUBLICATIONS

International Search Report mailed May 31, 2012 for PCT/KR2011/008351.

* cited by examiner

*Primary Examiner* — Nathan M Nutter
(74) *Attorney, Agent, or Firm* — Lowe Hauptman & Ham, LLP

(57) ABSTRACT

Disclosed is a sheet for use as a packaging material having a low percentage thermal shrinkage, outstanding flexibility and outstanding properties as a packaging material for solar cells. The sheet for use as a packaging material for solar cells according to the present invention is a resin sheet having air spaces obtained by the hot-melt bonding of a portion of a dispersed hot-bonding resin powder, wherein the apparent density of the sheet is no less than 20(%) and no more than 70(%) of the net density of the hot-bonding resin, such that the sheet is adequately flexible.

7 Claims, 2 Drawing Sheets

SHEET FOR USE AS A PACKAGING MATERIAL FOR SOLAR CELLS

TECHNICAL FIELD

The present invention relates to an encapsulant sheet for solar cells, which exhibits low thermal shrinkage and high flexibility.

BACKGROUND ART

In recent years, solar cells for directly converting sunlight into electric energy have been a focus of attention as a replacement for existing power generation systems depending on fossil fuels.

Referring to FIG. 1, an encapsulant sheet 4 formed of a hot-bonding resin is placed on a surface of a surface side protective member 1 formed of glass or a transparent resin, and a plurality of solar cell devices 3 is placed on the sheet 4. Likewise, another encapsulant sheet 4 is placed on the solar cell devices 3, and a rear side protective member 2 formed of glass or a resin is placed on the sheet 4 to form a laminated body.

The stacked sheets are integrated by pressing the two protective members 1, 2 while melting the encapsulant sheets 4, 4. FIG. 2 shows a solar cell module finished by melting the encapsulant sheets 4, 4 such that the encapsulant sheets 4, 4 are integrated with the other members. Here, an encapsulant 4' is formed by integrating the encapsulant sheets 4, 4.

Further, hot-bonding resin sheets used as the encapsulant sheets 4 are generally formed through extrusion or calendaring using T dies. Here, all of these hot-bonding resin sheets exhibit high thermal shrinkage. Thus, when hot-bonding resin sheets are used as the encapsulant sheets 4, the encapsulant sheet 4 can severely shrink when heated such that the solar cell devices 3 in the encapsulant sheets 4 can be displaced or damaged due to stress applied to the solar cell devices 3.

A hot-bonding resin sheet having low thermal shrinkage as disclosed in Patent Document 1 is well known in the art. Such a hot-bonding sheet exhibiting low thermal shrinkage is obtained by partially or completely melting a hot-bonding resin powder. The hot-bonding sheet obtained by partially or completely melting the hot-bonding resin powder has a lower thermal shrinkage than a sheet manufactured through extrusion using T dies or calendaring.

Thus, a problem of displacing or damaging the solar cell devices 3 due to shrinkage of the encapsulant sheets 4 of the solar cell can be solved when the hot-bonding resin sheet of Patent Document 1 is used as the encapsulant sheets 4 for solar cells.

In addition, Patent Document 2 also discloses a resin sheet, which is formed by stacking a resin layer containing a crosslinking agent and a layer free from any crosslinking agent to reduce thermal shrinkage.

[Patent Document 1] Japanese Patent Publication No. 2002-363507A

[Patent Document 2] Japanese Patent Publication No. 2009-4437A

DISCLOSURE

Technical Problem

Although the hot-bonding resin sheets designed to reduce thermal shrinkage are known in the art, such hot-bonding sheets have a problem of flexibility reduction when used as encapsulant sheets of a solar cell.

For example, the hot-bonding resin sheet disclosed in Patent Document 1 is illustrated as being obtained by completely melting hot-bonding resin powder, and such a hot-bonding resin sheet has flexibility similar to that of a sheet formed by extrusion. However, this patent document also discloses a hot-bonding resin sheet that can be obtained by partially melting the hot-bonding resin power, it is apparent that completely melting the hot-bonding resin powder would improve shrinkage but would hinder flexibility Further, it is apparent that flexibility is not the subject matter of the invention disclosed in Patent Document 2.

As described above, the use of a hot-bonding resin sheet lacking flexibility for an encapsulant sheet for solar cells can cause problems as follows.

That is, the encapsulant sheets 4, 4 of low flexibility have a difficulty bending along surfaces of the solar cell devices 3 interposed between the encapsulant sheets, and a gap is formed between edges of the solar cell devices 3 and the encapsulant sheets 4. When a gap is generated therebetween, it is difficult to close the gap even when the encapsulant sheets 4, 4 are melted, and the respective members are integrated, with the gap remaining as a cavity.

Then, although such pore does not substantially affect performance of a solar cell, the solar cell may be considered defective due to the unsightly appearance of the pore.

When the finished solar cell is considered defective despite minor influence on the performance of the solar cell, the finished cell cannot be recovered, thus meaning that all manufacturing stages were pointless.

An aspect of the present invention is to provide an encapsulant sheet for solar cells, which has low shrinkage upon heating and exhibits high flexibility while improving productivity of a solar cell module.

Technical Solution

In accordance with a first aspect, the present invention provides an encapsulant sheet for solar cells, wherein hot-bonding resin powders are partially melted and bonded to each other to maintain pores and the encapsulant sheet has an apparent density that is 20% to 70% of a net density of the hot-bonding resin.

In accordance with a second aspect, the present invention provides the encapsulant sheet as set forth in the first aspect, wherein the hot-bonding resin may include an ethylene copolymer containing 60 wt % to 90 wt % of ethylene and may have a melt mass-flow rate of 1 g/10 min to 50 g/10 min

Advantageous Effects

Since the encapsulant sheet for solar cells in accordance with the first and second aspects is formed by partially melting hot-bonding resin powder, the encapsulant sheet has much lower thermal shrinkage and flexibility than existing hot-bonding resin sheets. Thus, when the encapsulant sheet is used in manufacture of solar cell modules, it is possible to improve productivity of the solar cell modules by removing pores and reducing product defect rate.

Further, since the encapsulant sheet is formed to have an apparent density 20% to 70% of a net density of a hot-bonding resin and thus has pores therein, the encapsulant sheet has a sponge shape of a large volume, thereby providing cushioning properties. Thus, when pressure is applied to a protective member in manufacture of a solar cell, the encapsulant sheet absorbs the pressure, thereby making it possible to prevent solar cell devices from being damaged by external force in the manufacturing process.

When the encapsulant sheet has insufficient cushioning properties, the solar cell devices can be damaged when disposed between the encapsulant sheets and heated under pressure. However, if the encapsulant sheet has pores therein as in the present invention, the solar cell devices are not damaged even if pressure is applied thereto as described above.

In the second aspect of the present invention, the encapsulant sheet is formed of ethylene copolymer powder and thus exhibits improved resistance to sunlight. As a result, not only the encapsulant sheet for solar cells, but also the solar cell module may have improved durability.

Further, since the amount of the ethylene resin is adjusted to be 60 wt % or more in the ethylene copolymer, the ethylene copolymer may provide hot-bonding resin powder having good fluidity, improve treatability of the resin powder, and form a uniform encapsulant sheet.

In addition, since the amount of the ethylene resin is adjusted to be 90 wt % or less in the ethylene copolymer, an encapsulant sheet for solar cells having particularly high transparency and flexibility can be obtained.

Furthermore, since the melt mass-flow rate of the ethylene copolymer is adjusted to range from 1 g/10 min to 50 g/10 min, it is possible to maintain optimal fluidity of the encapsulant during hot-melt bonding of the solar cell device without contact error or residual pores, while preventing the encapsulant from escaping the protective members for the solar cell.

BEST MODE

Figure 1:
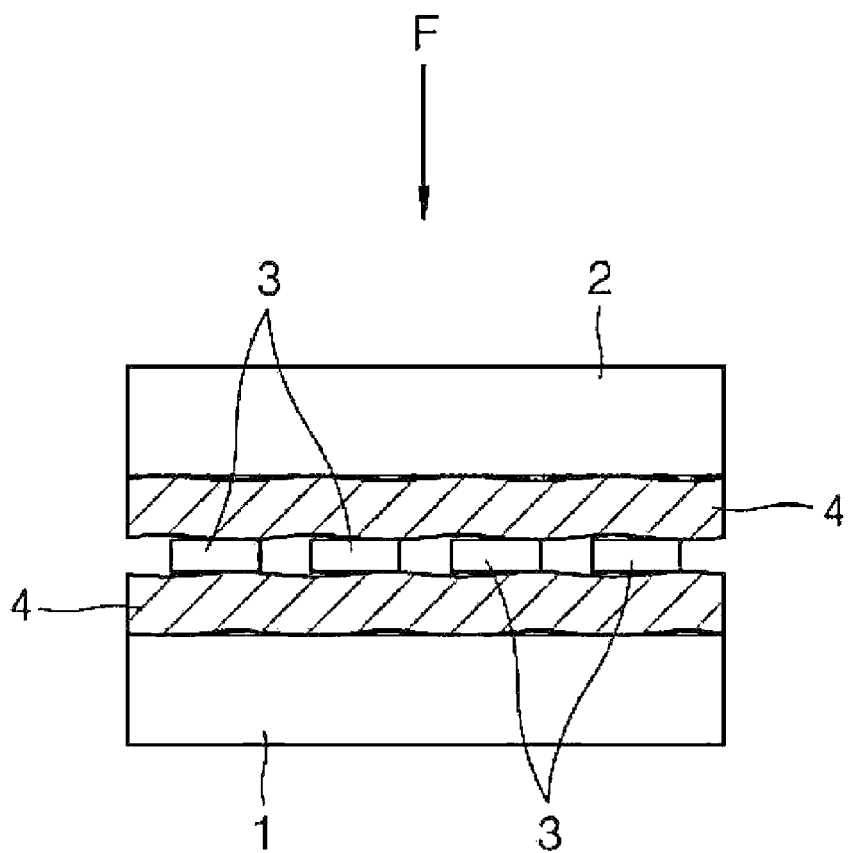
FIG. 1 is a sectional view of a general solar cell, showing a state in which encapsulant sheets are not subjected to hot-melt bonding.

Embodiments of the present invention will now be described in detail.

An encapsulant sheet for solar cells according to one embodiment of the present invention is a sheet formed by partially melting hot-bonding resin powder, and is characterized in that an apparent density thereof is 20% to 70% of a net density of a hot-bonding resin. Further, the encapsulant sheet according to the present embodiment will be used as the encapsulant sheet 4 of FIG. 1. Thus, the following description will also be made with reference to FIGS. 1 and 2.

Now, a method of forming an encapsulant sheet 4 according to one embodiment of the present invention will be described.

First, hot-bonding resin powder for the encapsulant sheet 4 may be obtained by grinding hot-bonding resin pellets through mechanical grinding, freeze grinding, chemical grinding, and the like. The particle size of the obtained powder is not particularly limited, but preferably ranges from 32 mesh to 200 mesh when fluidity of the powder and flexibility of the sheet are taken into account.

The hot-bonding resin powder prepared in this way is uniformly distributed on a delamination substrate, from which the hot-bonding resin can be separated, by a powder distributor or the like, and then is heated by a far infrared heater or the like. When the hot-bonding resin powder is partially melted and particles thereof are bonded to each other to form a sheet, the sheet is separated from the delamination substrate by cooling both the sheet and the delamination substrate to obtain an encapsulant sheet 4 for solar cells according to the present invention.

Since the encapsulant sheet 4 formed by this method does not extend in the machine direction during processing, the encapsulant sheet has a very low thermal shrinkage of less than 2%. Thus, when a solar cell is manufactured using the encapsulant sheet formed through this method, solar cell devices 3 can be prevented from being displaced or damaged by stress due to the thermal shrinkage of the encapsulant sheet 4.

Further, since the encapsulant sheet 4 is obtained by partially melting the powder, a plurality of pores is formed between the powders. The encapsulant sheet 4 having the pores has higher flexibility than a sheet formed only of a resin. Here, the flexibility of the encapsulant sheet increases with increasing number of pores therein. That is, the flexibility increases with decreasing ratio of the apparent density of the encapsulant sheet to a net density of a resin.

Further, the apparent density of the encapsulant sheet 4 for solar cells preferably is 20% to 70% of the net density of the hot-bonding resin for the following reason.

Since the encapsulant sheet 4 has too high a porosity when the apparent density of the encapsulant sheet 4 is less than 20% of the net density of the resin, it is difficult to extract air from the pores in the encapsulant sheet 4 during manufacture of the solar cell module, causing bubbles to remain in an encapsulant 4' obtained by melting the encapsulant sheet 4. In addition, if the porosity of the encapsulant sheet 4 is too high, it is difficult to maintain the shape of the encapsulant sheet, thereby causing increase in manufacturing costs.

Meanwhile, since the hot-bonding resin sheet, the ratio of the apparent density to the net density of which exceeds 70%, has low porosity, the flexibility of the hot-bonding resin sheet deteriorates, thereby making it difficult to form a desired encapsulant sheet 4 for solar cells.

Thus, in the present invention, the apparent density of the encapsulant sheet 4 is set to be 20% to 70% of the net density of the hot-bonding resin.

In this way, using the encapsulant sheet 4 having high flexibility, a gap between the solar cell devices 3 and the encapsulant sheet 4 decreases in size during manufacture of the solar cell, thereby making it possible to prevent pores from remaining in the encapsulant 4' after hot-melt bonding. That is, product defect rate due to the presence of pores can be reduced.

Further, the apparent density of the encapsulant sheet 4 may be adjusted by adjusting a distribution state of the resin powder on the delamination substrate, or a heating temperature and a heating time for melting the resin powder.

Further, since the pores are formed in the encapsulant sheet 4, the encapsulant sheet 4 acts as a sponge having a larger volume than an encapsulant sheet without any pores. As a result, the encapsulant sheet 4 has cushioning properties and may mitigate influence of external force on the solar cell devices 3 interposed between a pair of encapsulant sheets 4, 4 in manufacture of the solar cell.

Figure 2:
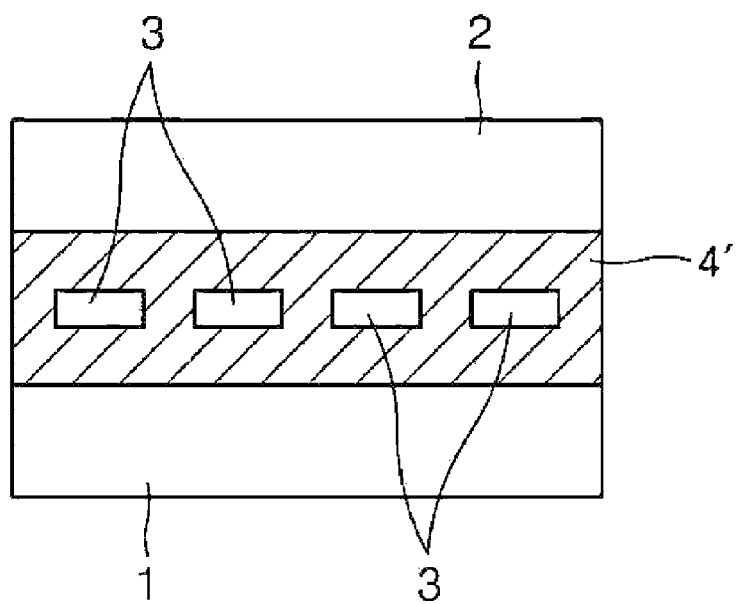
FIG. 2 is a sectional view of a general solar cell

Further, an optimal thickness of the encapsulant sheet 4 may depend on a thickness, size or arrangement of the solar cell devices to be bonded. Thus, it is necessary to firmly bond the solar cell devices 3 between two protective members 1, 2, as shown in FIG. 2, and to determine the thickness, size, or arrangement of the bonded solar cell devices based on the amount of resin which does not generate pores in the hot-bonded encapsulant 4' at the same time.

Further, if the thickness of the encapsulant sheet 4 is too small even though the amount of resin is sufficient to fill the pores, cushioning properties can become insufficient and the solar cell devices 3 can be damaged. Meanwhile, if the encapsulant 4' of the solar cell becomes too thick due to a large thickness of the encapsulant sheet 4, the optical transmittance of the encapsulant can be decreased, thereby causing decrease in electromotive force of the solar cell, and the encapsulant 4' can escape from the cross-section of the two protective members while the two protective members 1, 2 are bonded to each other.

Further, the hot-bonding resin used in manufacture of the encapsulant sheet 4 refers to a resin that exhibits adhesive properties upon application of heat thereto and example thereof include an ethylene copolymer, polyvinyl butyral, copolymer nylon, polyesters, and the like. Particularly, the ethylene copolymer exhibits outstanding properties in terms of processibility, durability, and the like.

The ethylene copolymer is a copolymer of ethylene and a resin copolymerizable with ethylene, and includes the following.

Examples of such ethylene copolymer include copolymers of ethylene and vinyl esters, such as vinyl acetate and vinyl propionate; copolymers of ethylene and unsaturated carboxylic acid esters, such as methyl acrylate, ethyl acrylate, isobutyl acrylate, n-butyl acrylate and methyl methacrylate; copolymers of ethylene and unsaturated carboxylic acids, such as acrylic acid and methacrylic acid; and copolymers of ethylene and monomers in which unsaturated carboxylic acids are partially neutralized with a metal salt, such as sodium, zinc or lithium, or σ-olefins, such as propylene, 1-butene, 1-hexene, 1-octene and 4-methyl-1-pentene. These copolymers may be used alone or as a mixture of two or more thereof.

Further, the content of ethylene in the ethylene copolymer for the encapsulant sheet 4 is preferably from 60 wt % to less than 90 wt %. If the amount of the ethylene is less than 60 wt %, the copolymer exhibits strong adhesion, thereby making it difficult to obtain powder. Further, even if powder can be obtained from such a copolymer, the powder has low flowability, thereby making it difficult to obtain uniform distribution of the powder. Non-uniform distribution of the resin powder can cause formation of a non-uniform encapsulant sheet 4. The non-uniform encapsulant sheet has a non-uniform porosity of the resin and a non-uniform thickness.

Further, when the ethylene is present in an amount of greater than 90 wt % in the copolymer, the encapsulant sheet has low transparency and flexibility and thus cannot be advantageously used for solar cells.

Further, the ethylene copolymer resin for the encapsulant sheet the according to the present invention preferably has a melt-mass flow rate of 1 g/10 min to 50 g/10 min, more preferably, 2 g/10 min to 40 g/10 min, as measured in accordance with JIS K6924-1. If the resin has a melt-mass flow rate of less than 1 g/10 min, the resin has low fluidity in a molten state and thus has a difficulty filling the gap between the encapsulant sheet 4 and the solar cell device 3 in manufacture of the solar cell, so that the pores can remain in the encapsulant sheet or bonding failure can occur. On the contrary, if the resin has a melt-mass flow rate of greater than 50 g/10 min, the adhesive resin has too high fluidity, thereby causing the adhesive resin to escape through a gap between the protective members 1, 2.

In addition, in order to improve the function of the encapsulant sheet 4 comprised of the ethylene copolymer, the adhesive resin may further include additives as follows.

One or more crosslinking agents may be further added for the purpose of improving heat resistance, transparency and adhesion of the encapsulant sheet 4 comprised of the ethylene copolymer. As the crosslinking agent, an organic peroxide having a 1-hour half-life temperature of 70° C. to 180° C., more preferably 90° C. to 160° C. is advantageously used. Examples of the organic peroxide include tert-butyl peroxyisopropyl carbonate, tert-butyl peroxy-2-ethylhexyl carbonate, tert-butyl peroxyacetate, tert-butyl peroxybenzoate, tert-butyl dicumylperoxide, 2,5-dimethyl-2,5-bis(tert-butylperoxy)hexane, di-tert-butylbutylperoxide, 2,5-dimethyl-2,5-bis(tert-butylperoxy)hexyne-1,1-bis(tert-butylperoxy)cyclohexane, methyl ethyl ketone peroxide, 2,5-dimethylhexyl-2,5-bisperoxybenzoate, tert-butyl hydroperoxide, p-methane hydroperoxide, benzoyl peroxide, p-chlorobenzoyl peroxide, tert-butyl peroxyisobutyrate, hydroxyheptyl peroxide, and cyclohexanone peroxide.

The organic peroxide is present an amount of 0.1~15 parts by weight, preferably 0.5~5 parts by weight based on 100 parts by weight of the ethylene copolymer.

For better cross-linking efficiency, one or more cross-linking accelerators may be further added. As the cross-linking accelerators, there may be mentioned, for example, triaryl cyanurates, triaryl isocyanurates, and (meth)acrylic esters. The cross-linking accelerators are present in a total amount of 0.05 to 15 parts by weight, preferably 0.1 to 5 parts by weight, based on 100 parts by weight of the ethylene copolymer.

One or more silane coupling agents may be further added for the purpose of improving adhesion of the ethylene copolymer. Examples of the silane coupling agents may include γ-chloropropylmethoxysilane, vinylethoxysilane, vinyltris (β-methoxyethoxy)silane, γ-methacryloxypropyltrimethoxysilane, vinyltriacetoxysilane, γ-glycidoxypropyltrimethoxysilane, γ-glycidoxypropyltriethoxysilane, β-(3,4-epoxycyclohexyl)ethyltriethoxysilane, vinyltrichlorosilane, γ-mereaptopropyltrimethoxysilane, γ-aminopropyltriethoxysilane, and N-γ-(aminoethyl)-γ-aminopropyltrimethoxysilane. These silane coupling agents are present in a total amount of 0.05 to 5 parts by weight, preferably 0.1 to 1 part by weight, based on 100 parts by weight of the ethylene copolymer.

One or more additives selected from among UV absorbers, light stabilizers and antioxidants may be further added to the ethylene copolymer to protect the adhesive resin against UV degradation.

Examples of the UV absorbers may include: benzophenones, such as 2-hydroxy-4-methoxybenzophenone, 2,2-dihydroxy-4-methoxybenzophenone, 2-hydroxy-4-methoxy-2-carboxybenzophenone, and 2-hydroxy-4-octoxybenzophenone; benzotriazoles, such as 2-(2-hydroxy-3,5-ditert-butylphenyl)benzotriazole, 2-(2-hydroxy-5-methylphenyl)benzotriazole, and 2-(2-hydroxy-5-tert-octylphenyl)benzotriazole; salicylic acid esters, such as phenyl salicylic acid salts, and p-octylphenylsalicylic acid salts; and 2-ethyl-2'-ethoxyoxanilide.

As the light stabilizers, hindered amines are preferred.

As the antioxidants, hindered phenolic antioxidants, phosphorus-based light stabilizers, lactone-based light stabilizers, and sulfur-based light stabilizers may be used.

These additives may be present in a total amount of 0.01 to 2 parts by weight, preferably 0.03~1 part by weight, based on 100 parts by weight of the ethylene copolymer.

Since the encapsulant sheet 4 has outstanding flexibility, the encapsulant sheet 4 may be used as an effective encapsulant that can be introduced into a pore, for example, between a surface protective member such as glass and a solar cell produced by Kyosemi Inc., which has severe irregularity, thereby preventing the pore from remaining.

MODE FOR INVENTION

The above and other aspects, features, and advantages of the present invention will become apparent from the detailed description of the following embodiments in conjunction with the accompanying drawings. It should be understood that the present invention is not limited to the following embodiments and may be embodied in different ways, and that the embodiments are provided for complete disclosure and thorough understanding of the invention to those skilled in the art. The scope of the invention is defined only by the claims.

EXPERIMENTAL EXAMPLES

Now, effects of the encapsulant sheet 4 according to the present invention will be described with reference to an example and a comparative example. However, these examples are not intended to limit the invention.

Further, thermal shrinkage and apparent density of the encapsulant sheet in the following examples were measured by the following method. In addition, thermal shrinkage and apparent density of the encapsulant sheet of the comparative example were also measured using the same method.

(1) Measurement of Thermal Shrinkage

Five test pieces having a width of 20 mm and a length of 150 mm were obtained from an encapsulant sheet prepared as follows, and mark lines were drawn at distances of 100 mm from the center of the test pieces.

After the samples were submerged in hot water at 80° C. for 30 seconds and then were withdrawn, the distances between the marks were measured and a thermal shrinkage ΔL was calculated according to the following equation.

$$\Delta L = [(L_1 - L_2)/L_1] \times 100$$

ΔL: Thermal shrinkage (%)
$L_1$: Distance between marks before heating (mm)
$L_2$: Distance between marks before heating (mm)

(2) Measurement of Apparent Density

An apparent density D of the sheet was calculated according to the following equation using the test samples.

$$D = W/V$$

W: Weight of the sheet per unit area (g/cm$^2$)
V: Volume of the sheet per unit area (cm$^3$/cm$^2$)

Example

An ethylene vinyl acetate copolymer (100 parts by weight) containing 28% by weight of vinyl oxide and having a melt-mass flow rate of 18 g/10 min was mixed with 1 part by weight of a crosslinking agent, that is, tert-butylperoxy-2-ethylhexylcarbonate having a 1-hour half-life temperature of 119.3° C. and 0.5 parts by weight of a silane coupling agent, that is, γ-methacryloxypropyltrimethoxysilane, followed by melting and kneading at a resin temperature of 100° C. through an extruder, thereby preparing a hot-bonding resin. The prepared hot-bonding resin had a net density of 948 kg/m$^3$.

Then, the hot-bonding resin was frozen in liquid nitrogen and ground to prepare hot-bonding resin powders having a particle size of 42 meshes to 200 mesh.

Then, the hot-bonding resin powder was evenly distributed on a delamination substrate using a powder distributor and heated to 110° C. by using far-infrared heater, thereby preparing an encapsulant sheet 4 in which the resin powder was partially melted and bonded together. The encapsulant sheet 4 has a thickness of 1 mm and a weight per unit area of 400 g/cm$^2$. The encapsulant sheet has an apparent density of 400 kg/m$^3$, which is 42% of the net density of the hot-bonding resin.

In addition, the encapsulant sheet 4 of this example had a thermal shrinkage of 0.5%.

A solar cell module was manufactured using the encapsulant sheet 4 of the example.

As shown in FIG. 1, an encapsulant sheet 4 was placed on a surface of a surface side protective member 1 formed of glass, and a plurality of solar cell devices 3 was placed on the sheet 4. Likewise, another encapsulant sheet 4 was placed on the solar cell devices 3, and a rear side protective member 2 formed of glass was placed on the sheet 4 to form a laminated body.

The laminated body was set in a laminator for manufacturing a solar cell, and was pressed at a pressure of 1 kgf/cm$^2$ for 5 minutes after evacuation at a heating temperature of 130° C. for 3 minutes.

100 solar cell modules were manufactured in the same manner There was no damage, displacement, formation of pores in the solar cell devices 3, and the like.

That is, a defective product was not generated.

Comparative Example

To compare with the encapsulant sheet of the example described above, an encapsulant sheet, the apparent density of which is greater than 70% of a net density of a thermoplastic resin, was manufactured.

In the comparative example, the encapsulant sheet was manufactured in the same manner as in the example except that the hot-bonding resin powder was dispersed on the delamination substrate and melted by heating the resin at 130° C. using a far-infrared heater. Since the heating temperature using the far-infrared heater was increased, the hot-bonding resin powders were generally bonded to each other, thereby allowing a small number of pores to remain in the sheet of the comparative example. The encapsulant sheet of the comparative example had a thickness of 0.45 mm, which is half or less of the thickness of the encapsulant sheet of the example.

In addition, the encapsulant sheet of the comparative example had a weight per unit area of 400 g/cm$^2$ and an apparent density of 889 kg/m$^3$. That is, the apparent density of the encapsulant sheet of the comparative example is 94% of the net density of the hot-bonding resin.

100 solar cell modules were manufactured using the encapsulant sheet of the comparative example under the same conditions as in the example. In manufacture of the solar cell modules, two solar cell devices were damaged.

In addition, although there was no displacement of the solar cell devices, pores could be viewed in the encapsulant sheets of three solar cell modules.

That is, a rate of defective products was 5%.

In this way, the encapsulant sheet of the comparative example provided defective solar cell modules. This is believed to have occurred for the following reasons.

The encapsulant sheet of the comparative example has a high apparent density and thus has a low porosity, thereby providing insufficient flexibility. Thus, it is believed that pores formed between the solar cell device and the encapsulant sheet expand in the manufacturing process of the solar cell module, thereby making it difficult to fill the pores with the molten encapsulant resin.

Further, as described above, the encapsulant sheet of the comparative example has a lower porosity and a smaller thickness than the encapsulant sheet of the example. Thus, it is believed that the encapsulant sheet of the comparative example provides poor cushioning properties, thereby causing pressure to be applied to the solar cell device in the manufacturing process.

DESCRIPTION OF REFERENCE NUMERALS

1: surface side protective member
2: rear side protective member
3: solar cell device
4: encapsulant sheet
4': encapsulant

INDUSTRIAL APPLICABILITY

Therefore, the present invention may provide an encapsulant sheet, which exhibits low thermal shrinkage, outstanding flexibility, and outstanding performance as an encapsulant sheet for solar cells.

The invention claimed is:

1. An encapsulant sheet for solar cells, the encapsulant sheet comprising hot-bonding resin powders which are partially melted and bonded to each other to maintain pores,
wherein the encapsulant sheet has an apparent density that is 20% to 70% of a net density of the hot-bonding resin,
wherein the hot-bonding resin comprises an ethylene copolymer containing 60 wt % to 90 wt % of ethylene, and
wherein the hot-bonding resin has a melt mass-flow rate of 1 g/10 min to 50 g/10 min.

2. The encapsulant sheet according to claim 1, wherein the hot-bonding resin comprises a crosslinking agent including an organic peroxide.

3. The encapsulant sheet according to claim 1, wherein the hot-bonding resin comprises a crosslinking accelerator including at least one of a triaryl cyanurate, a triaryl isocyanurate, or an (meth)acrylic ester.

4. The encapsulant sheet according to claim 1, wherein the hot-bonding resin comprises a silane coupling agent.

5. The encapsulant sheet according to claim 1, wherein the hot-bonding resin comprises an UV absorber.

6. The encapsulant sheet according to claim 1, wherein the hot-bonding resin comprises a light stabilizer including a hindered amine.

7. The encapsulant sheet according to claim 1, wherein the hot-bonding resin comprises an antioxidant including at least one of a hindered phenolic antioxidant, a phosphorus-based light stabilizer, a lactone-based light stabilizer, or a sulfur-based light stabilizer.

* * * * *